US012733110B2

(12) United States Patent
Olk et al.

(10) Patent No.: US 12,733,110 B2
(45) Date of Patent: Sep. 8, 2026

(54) METHOD OF FURNISHING THREE-DIMENSIONAL OBJECTS WITH ELECTRICALLY CONDUCTIVE STRUCTURES HAVING LOW TOPOGRAPHY AND LOW SURFACE ROUGHNESS

(71) Applicant: IEE INTERNATIONAL ELECTRONICS & ENGINEERING S.A., Echternach (LU)

(72) Inventors: Michael Olk, Welschbillig-Träg (DE); Driss Chabach, Noertrange (LU); Pascal Schmalen, Berdorf (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 479 days.

(21) Appl. No.: 18/035,170

(22) PCT Filed: Nov. 5, 2021

(86) PCT No.: PCT/EP2021/080821

§ 371 (c)(1),
(2) Date: May 3, 2023

(87) PCT Pub. No.: WO2022/096672

PCT Pub. Date: May 12, 2022

(65) Prior Publication Data

US 2025/0358938 A1 Nov. 20, 2025

(30) Foreign Application Priority Data

Nov. 6, 2020 (LU) .................................. LU102189
Dec. 3, 2020 (LU) .................................. LU102265

(51) Int. Cl.
*H05K 3/14* (2006.01)
*H05K 1/03* (2006.01)
(Continued)

(52) U.S. Cl.
CPC ........... *H05K 3/143* (2013.01); *H05K 1/0313* (2013.01); *H05K 1/0393* (2013.01); *H05K 3/26* (2013.01);
(Continued)

(58) Field of Classification Search
CPC .......... C23C 4/134; H05K 3/14; H05K 3/143; H05K 1/0393; H05K 3/26; H05K 1/0313; B26D 1/065; H01B 3/134
See application file for complete search history.

(56) References Cited

U.S. PATENT DOCUMENTS 4,242,378 A 12/1980 Arai
5,891,527 A 4/1999 Turek et al.
(Continued)

FOREIGN PATENT DOCUMENTS

CN 101754571 * 6/2014
CN 105265029 * 1/2016
(Continued)

OTHER PUBLICATIONS

Felipe Miranda, Felipe Caliari, Alexei Essiptchouk and Gilberto Pertraconi (Nov. 5, 2018), Atmospheric Plasma Spray Processes: From Micro to Nanostructures, Atmospheric Pressure Plasma—from Diagnostics to Applications, Anton Nikiforov and Zhiqiang Chen, IntechOpen, DOI: 10.5772/intechopen.80315.
(Continued)

*Primary Examiner* — Tabassom Tadayyon Eslami
(74) *Attorney, Agent, or Firm* — Reising Ethington P.C.

(57) ABSTRACT

A method of producing an assembly of structured members comprises: providing a flat substrate from plastic material; printing on the substrate tracks of a first thickness and corresponding to an intended course of the structured members from a material with strong adherence ($AD_1$, $AD_2$) to both the plastic material substrate and the electrically con-
(Continued)

ductive material; printing a masking material with the first thickness directly on the surface, the masking material having an adherence ($AD_4$) to the plastic material substrate that is larger than an adherence ($AD_3$) to the electrically conductive material, wherein $AD_1$ is larger than $AD_3$; applying an atmospheric plasma spray process to cover each of the tracks and a portion of the masking material adjacent each respective track with the electrically conductive material; and applying a cleaning process to remove the electrically conductive material from at least the portion of the masking material adjacent to each respective track.

5 Claims, 2 Drawing Sheets

(51) Int. Cl.
*H05K 3/26* (2006.01)
*B62D 15/02* (2006.01)

(52) U.S. Cl.
CPC .... *B62D 15/029* (2013.01); *H05K 2201/0129* (2013.01); *H05K 2201/10151* (2013.01)

(56) References Cited

U.S. PATENT DOCUMENTS 5,891,528 A * 4/1999 Turek ........................ C23C 4/01 427/97.8
6,703,845 B2 3/2004 Stanley et al.
6,965,071 B2 11/2005 Watchko et al.
7,374,794 B2 5/2008 Kastner et al.
7,521,940 B2 4/2009 Koch et al.
8,278,602 B2 10/2012 Yoneyama
8,330,079 B2 12/2012 Yasuda
2006/0065888 A1* 3/2006 Lazarev ................. H10K 10/84 438/570
2009/0295199 A1 12/2009 Kincaid et al.
2011/0148648 A1 6/2011 Fischer
2014/0339211 A1 11/2014 Barfuss et al.
2017/0125833 A1* 5/2017 Hwang ............... H01M 8/1286
2017/0207524 A1* 7/2017 Cardinali ............... H05K 3/284
2018/0093326 A1* 4/2018 Ishida ................... C04B 35/111
2019/0059152 A1* 2/2019 Boozer ................ H05K 1/0216

FOREIGN PATENT DOCUMENTS

WO 9217344 A1 10/1992
WO 9513204 A1 5/1995
WO 2013050621 A2 4/2013
WO 2015/024909 * 2/2015
WO 2015024909 A1 2/2015
WO 2015055486 A1 4/2015
WO 2015107059 A1 7/2015
WO 2016096815 A1 6/2016
WO 2020043863 A1 3/2020

OTHER PUBLICATIONS

Sampath, S., Thermal Spray Applications in Electronics and Sensors: Past, Present, and Future, J Therm Spray Tech 19, 921-949 (2010) (https://doi.org/10.1007/s11666-010-9475-2).
International Search Report for application No. PCT/EP2021/080821, dated Mar. 2, 2022, 4 pages.
Written Opinion for application No. PCT/EP2021/080821, dated Mar. 2, 2022, 7 pages.
J. R. Smith et al., Electric Field Sensing for Graphical Interfaces, IEEE Comput. Graph. Appl., 18(3):54-60, 1998.

* cited by examiner

METHOD OF FURNISHING THREE-DIMENSIONAL OBJECTS WITH ELECTRICALLY CONDUCTIVE STRUCTURES HAVING LOW TOPOGRAPHY AND LOW SURFACE ROUGHNESS

TECHNICAL FIELD

The invention relates to a method of producing an assembly of one or more structured members from an electrically conductive material on a plastic material substrate, and such assembly that is obtainable by such method.

BACKGROUND

In many technical fields there are applications that require a surface of a 3-dimensional object to be equipped with at least one electrically conductive structure. In some cases, such as in the field of automotive applications requirements may prevail that such structures should be unnoticeable to a user if not in operation. Another requirement may be that such conductive structures have to be arranged close to a top decor surface of the object to enable optimal performance.

In the field of automotive engineering, typical applications to which the above applies are capacitive sensing electrodes and electrical resistance heaters.

For example, from U.S. Pat. No. 8,330,079 B2 a steering wheel is known including a rim, first heating members, second heating members, and a control section. The rim has leather-covered portions and wood-grain portions. The surface of the leather-covered portions has a thermal conductivity different from the thermal conductivity of the surface of the wood-grain portions. Each first heating member is provided inside of the surface of the corresponding leather-covered portion. When being energized, each first heating member adjusts the surface temperature of the corresponding leather-covered portion. Each second heating member is provided inside of the surface of the corresponding wood-grain portion. When being energized, each second heating member adjusts the surface temperature of the corresponding wood-grain portion. The control section controls the energization of the first heating members and the energization of the second heating members independently from each other.

As an example for the use of capacitive sensing electrodes, it is known to employ those for so-called Hands off Detection (HOD) systems, in which one or more sensors provide information about whether a driver has his hands on a steering wheel of a vehicle or not. This information can be provided as input to an Automatic Driver Assistance System (ADAS) such as an Adaptive Cruise Control (ACC), which, based on the provided sensor signal, can alert the driver and remind him or her to take control of the steering wheel again. In particular, such HOD systems can be used in support to fulfill a requirement of the Vienna convention that the driver must remain in control of the vehicle at all times. HOD systems may as well be employed in a parking assistance system or an ADAS that is configured for evaluating a driver activity at high speed.

A capacitive sensor or capacitive sensing device, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sense electrode at which the influence of an object or living being on the electric field is detected. In some (so-called "loading mode") capacitive sensors, the one or more antenna electrodes serve at the same time as sense electrodes. In this case, the measurement circuit determines the current flowing into the one or more antenna electrodes in response to an oscillating voltage being applied to them. The relationship of voltage to current yields the complex impedance between the one or more antenna electrodes and ground. In an alternative version of capacitive sensors ("coupling mode" capacitive sensors), the transmitting antenna electrode(s) and the sense electrode(s) are separate from one another. In this case, the measurement circuit determines the current or voltage that is induced in the sense electrode when the transmitting antenna electrode is operating.

The different capacitive sensing mechanisms are explained in the technical paper entitled "Electric Field Sensing for Graphical Interfaces" by J. R. Smith et al., published in IEEE Comput. Graph. Appl., 18(3):54-60, 1998. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling. "Shunt mode" is alternatively referred to as the above-mentioned "coupling mode".

The capacitive coupling may be determined by applying an alternating voltage signal to a capacitive antenna electrode and by measuring the current flowing from the antenna electrode either towards ground (in the loading mode) or into the second electrode (receiving electrode) in case of the coupling mode. This current may be measured by means of a transimpedance amplifier, which is connected to a sensing electrode and which converts a current flowing into the sensing electrode into a voltage, which is proportional to the current flowing into the antenna electrode.

In the prior art it has also been proposed to combine capacitive sensors with heating devices, particularly in vehicle steering wheels, and also in vehicle seats.

This is illustrated, by way of example, in US 2011/0148648 A1, which describes a capacitive occupant sensing system for a vehicle seat. An electrode is arranged in a seat proximate to an expected location of an occupant for sensing an occupant proximate thereto. The electrode may be integrated with a seat heater. A control circuitry controls the seat heater. A signal generator is coupled to the electrode and configured to output to the electrode a plurality of signals at a plurality of frequencies. Occupant detection circuitry detects voltages responsive to the plurality of signals at the plurality of frequencies and detects a state of occupancy based on the detected voltages. An LC circuit coupled to the electrode and the control circuitry suppresses capacitance generated by the control circuitry. The LC circuit may include a common mode choke to suppress the effects of external capacitance influences.

WO 92/17344 A1 describes an electrically heated vehicle seat with a conductor, which can be heated by the passage of electrical current, and which is located in the seating surface, wherein the conductor also forms one electrode of a two-electrode seat occupancy sensor.

WO 95/13204 A1 discloses a similar system, in which the oscillation frequency of an oscillator connected to the heating element is measured to derive the occupancy state of the vehicle seat. More elaborate combinations of a seat heating device and a capacitive sensor are disclosed, for instance, in U.S. Pat. No. 7,521,940 B2, US 2009/0295199 A1 and U.S. Pat. No. 6,703,845 B2.

U.S. Pat. No. 6,703,845 B2 describes an occupant sensor. An oscillatory or pulsed first signal is applied to a seat heating element that is operatively connected to first and second impedances that isolate the first signal from the source and sink of power to the heating element. In another embodiment, third and fourth impedances are connected to the first and second impedances at respective nodes, and a second signal substantially equal to the first signal is operatively coupled to the nodes. In another embodiment, the first signal is applied to an electrode, and the second signal is applied to the heating element, which shields the electrode from influence by the seat. In another embodiment, the first signal is applied to a first electrode that is shielded from the heating element by a second electrode operatively coupled to the second signal. The impedances may, for example, be provided by inductors or electronic switches.

Further, US 2014/0339211 A1 proposes a combination heater that includes sensing capabilities so that the heater both heats and senses the presence of an occupant in a vehicle, the position of an occupant, or both. The combination of heater and sensor is free of discrete components and comprises: a) a heating layer, a sensing layer, or both; and b) one or more power application portions, one or more sensing application portions, or both. The heating layer and the sensing layer are located within the same plane. The heating layer is a non-woven layer that comprises a plurality of metallized fibers that are randomly oriented forming the heating layer so that upon application of power the heating layer provides heat. The plurality of fibers may be a plurality of polymeric fibers that are coated with a metal so that the plurality of metal coated polymeric fibers is conductive.

A method is proposed that comprises steps of installing the combination heater and sensor into a component of an automobile; (b) providing power to the combination heater and sensor so that a heating layer of the combination heater and sensor produces heat; (c) providing a signal to the combination heater and sensor so that a sensing layer of the combination heater and sensor produces a signal for determining presence of an occupant, contact between the occupant and the component of the automobile, or both; and (d) monitoring the signal for an occupant, lack of an occupant, lack of contact between the component and the occupant, or a combination thereof.

The large relative curvatures of a rim of a vehicle steering wheel, which are present in two independent directions of a surface of the rim, put up especially high demands with regard to fulfilling the requirement of sense electrodes and/or electrical resistance heaters being unnoticeable to a user. An ongoing requirement for such applications is of course that of miniaturization.

Despite an excellent capability for carrying high current density, the prevailing combined requirements generally rule out the use of conventional heating wires such as wires made from copper, as wires require a padding material to equalize topography, resulting in a large distance between an electrode and a top décor.

Striving to meet the mentioned requirements, solutions have been proposed in the prior art to unremarkably integrate heaters in a steering wheel.

For instance, U.S. Pat. No. 8,278,602 B2 describes a heating element for a steering wheel. The heating element includes a base material and a heater disposed on the base material, which can be deformed to accommodate a part of the heater. A steering wheel equipped with the heating element is free from surface protrusions caused by the heater. Employment of a linear heater reduces connections between the heater and power supply lines, and a high connecting reliability is obtained. The steering wheel includes the heating element and the power lines, and connections between the heating element and the power lines are disposed in the boss portion of the steering wheel. The steering wheel is provided with a temperature detector, a temperature detector heater and a temperature controller, and the detector and the detector heater are disposed in the boss portion.

Other approaches have been proposed in the prior art that employ foil heater members, i.e. heater members having the appearance of a thin flexible foil or film.

For instance, international application WO 2015/024909 A1 describes a foil heater for a heating panel. The foil heater comprises a first and a second spiral resistive heating trace formed in a first and a second layer, respectively, that conforms to a flat or curved surface. The first and second spiral resistive heating trace may be manufactured by (rotary) screen printing, gravure printing, flexographic printing or inkjet printing of an electrically conductive ink, followed by a curing/sintering step. Each of the first and second resistive heating traces has a center and at least one outer extremity. An electrically insulating layer is arranged between the first and second layer. The electrically insulating layer comprises an opening that accommodates an electrical via, through which the first and second resistive heating traces are electrically contacted with each other. The foil heater is compatible with operation at lower temperature. Due to their spiral shape, the heating traces can be routed densely over the entire heating surface substantially without crossings. A significantly more uniform temperature distribution can thus be achieved.

Other solutions in the prior art propose combining a capacitive sensor function and a heating function in a foil-type member.

For example, WO 2016/096815 A1 proposes a planar flexible carrier for use in steering wheel heating and/or sensing of the presence of the driver's hand(s) on the steering wheel. The planar carrier, which can be employed for mounting on a rim of a steering wheel without wrinkles, comprises a portion of planar flexible foil of roughly rectangular shape having two longitudinal sides and two lateral sides. A length B of the lateral sides is 0.96 to 1.00 times the perimeter of the rim. A number of N cut-outs per unit length are provided on each of the longitudinal sides, wherein the cut-outs of one side are located in a staggered fashion relative to opposing cut-out portions on the opposite side. The determining of an optimum shape and size of the cut-outs is described. Further described is a heat carrier, a heating and/or sensing device and methods for their production.

Another approach has been taken by international application WO 2013/050621 A2, which describes electrically conductive textiles for occupant sensing and/or heating applications, wherein the sensor and/or heater can be attached from the backside to a surface such as a driver seat, a passenger seat, a backseat, a steering wheel, a door side of compartment, a gear shift lever, etc.

A flexible heater and/or electrode comprises a woven textile material having a warp direction and a weft direction. The textile material comprises at least one region having a low electrical conductance and at least two regions having a high electrical conductance. The at least two regions of high electrical conductance are adjacent to the at least one region of low electrical conductance. At least one of the at least two regions of high electrical conductance is operatively connected to a connection terminal of the heater and/or electrode, wherein the connection terminal serves for connecting the heater and/or electrode to an electronic control circuit.

Resistive heating traces may be made by (rotary) screen printing, gravure printing, flexographic printing or inkjet printing of an electrically conductive ink and could be easily integrated close to a surface of an object to be heated. Electrically resistive inks exhibiting a positive temperature coefficient (PTC), which is desirable as such materials are inherently self-limiting, are readily commercially available. However, their use for feed lines is limited as required sheet resistances are achievable only with inks having a high silver load. This has a large impact on cost efficiency and further results in a significant decrease of the mechanical robustness in terms of resistance to bending of the printed conductor path, as highly conductive silver inks are known to be mechanically fragile. Any compression, bending and/or elongation stress that may be applied by an operator during installation or, for instance by a seat occupant in case of a seat heating device, may compromise an electrical resistance of one or more resistive heater elements to increase due to formed cracks or fissures, resulting in a reduced heating power, up to an extent that may eventually lead to the electric heating device becoming non-operable.

Various methods are known from other technical fields, which produce coatings or electrically conductive structured members on substrates such as plastic materials. One of these methods is plasma spraying.

By way of example, WO 2015/107059 A1 describes a plasma coating method for depositing a functional layer on a surface of a substrate and to a device for carrying out the coating method. The plasma coating method allows for high coating speeds and is carried out under normal atmospheric conditions. This is achieved in that an atmospheric plasma and an inert carrier gas are used so that very high energies can be introduced into the coating material in order to start a chemical reaction, and a controllable chemical reaction is allowed while excluding atmospheric oxygen in the plasma. The coating material for forming the functional layer is supplied directly into the plasma, which is generated in a nozzle, via a supply line while excluding oxygen. By using silver as a coating material, layers with high electrical conductivity, heat protection glazing and antibacterial coatings can be produced. Glass is mentioned as the material for the substrate.

Moreover, U.S. Pat. No. 5,891,527 A describes a printed circuit board process using plasma spraying of conductive metal. The method for forming a printed circuit board, comprises steps of: a) preparing at least one surface of a substrate with a pattern including selected areas for receiving copper and non-selected areas to which copper will not adhere, the non-selected areas being coated with a layer of adhesion-resistant material having a surface which is smooth/glossy such that copper does not adhere thereto, the pattern being formed by selectively removing only the adhesion-resistant material, the layer of the adhesion-resistant material being sufficiently thin that the selected and non-selected areas are substantially coplanar without any grooves or ridges defining the pattern; and thereafter b) plasma spraying the at least one surface with copper to coat the selected areas with copper while the non-selected areas remain substantially free of copper. The substrate may be formed from any of a variety of typical circuit board substrate materials, including thermoset resins, thermoplastic resins, ceramics and combinations thereof.

Furthermore, U.S. Pat. No. 6,965,071 B2 proposes thermal-sprayed metallic conformal coatings used as heat spreaders. The method of dissipating heat from an electronic device having an enclosure, which may be made from a plastic material, and at least one heat-generating source received within the enclosure, the enclosure having one or more parts, and at least one of the parts having an exterior surface and an opposing interior surface, comprises the steps of: (a) covering at least a portion of the interior surface of the one of the enclosure parts with a conformal metallic layer by the steps of: (i) providing a feed material comprising a metal or metal alloy; (ii) heating the feed material of step into a molten state; (iii) atomizing the feed material of step (ii) while in the molten state; (iv) spraying the atomized feed material of step (ii) while in the molten state on the portion of the interior surface of the one of the enclosure part to form a self-adherent coating of the metal thereon; and (v) solidifying the coating of step (iii) to form the conformal metallic layer; and (b) disposing the conformal metallic layer covered on the one of the enclosure parts and the source in heat transfer adjacency with each other. The metallic layer may comprise tin, nickel, copper, zinc, aluminum, silver, or an alloy thereof.

Then, WO 2015/055486 A1 describes a method to enable a permanent coating of molded bodies made of plastic by means of atmospheric plasma. The method comprises the following steps: producing a molded body of a composite material, which composite material comprises at least one thermoplastic polymer as a base material and at least boron nitride as an inorganic filler, wherein the volume fraction of the filler is 1-50% of the volume of the molded body; and coating at least part of the molded body with the coating material by means of atmospheric plasma. Further described is a component comprising a molded body having a coating material that can be produced according to such method.

The article by Sampath, S., Thermal Spray Applications in Electronics and Sensors: Past, Present, and Future, J Therm Spray Tech 19, 921-949 (2010) (https://doi.org/10.1007/s11666-010-9475-2) presents an analysis of future intriguing possibilities for thermal spray technology in the world of thick-film sensors.

In the open access peer-reviewed chapter of the book by Felipe Miranda, Felipe Caliari, Alexei Essiptchouk and Gilberto Pertraconi (Nov. 5, 2018), Atmospheric Plasma Spray Processes: From Micro to Nanostructures, Atmospheric Pressure Plasma-from Diagnostics to Applications, Anton Nikiforov and Zhiqiang Chen, IntechOpen, DOI: 10.5772/intechopen.80315 (available from: https://www.intechopen.com/books/atmospheric-pressure-plasma-from-diagnostics-to-applications/atmospheric-plasma-spray-processes-from-micro-to-nanostructures) describes atmospheric plasma spray as being capable of processing a wide variety of materials, including metallic and refractory materials at atmospheric pressure. The coatings properties are improved by deposition of coatings with finer microstructure, which is more suitable for mechanical and thermal stresses that the lamellar microstructure of conventional plasma-sprayed coatings.

SUMMARY

It is therefore an object of the invention to provide a method for producing an assembly of one or more structured members from an electrically conductive material on a plastic material substrate, with an as large as possible ampacity, a low surface roughness, a reduced tendency to form cracks or fissures in case of occurring mechanical stress (bending stress or other), and a low overall topographic variation. It is another object of the invention to provide an assembly of one or more structured members from an electrically conductive material on a substrate from plastic material, with the structured members having the properties above, and the assembly having a low overall topographic variation.

In one aspect of the present invention, the object is achieved by a method of producing an assembly of one or more structured members from an electrically conductive material on a plastic material substrate, the method comprising at least the following steps:

- providing an at least locally flat substrate from plastic material,
- printing on a surface of the plastic material substrate a track or tracks of a first predefined thickness and corresponding to an intended course of the one or more structured members from a material with strong adherence to both the plastic material substrate and the electrically conductive material,
- printing a masking material with the first predefined thickness directly on the surface of the plastic material substrate, the masking material having an adherence to the plastic material substrate that is larger than an adherence to the electrically conductive material,
- wherein the adherence of the track material to the electrically conductive material is larger than the adherence of the masking material to the electrically conductive material,
- applying an atmospheric plasma spray process to cover the track or the tracks and at least a portion of the masking material adjacent to each respective track with the electrically conductive material with a second predefined thickness, and
- applying a cleaning process to remove the electrically conductive material from at least the portion of the masking material adjacent to each respective track.

The term "structured member", as used in this patent application, shall particularly be understood to be distinct from a mere layer deposited on the surface of the plastic material substrate. The term "structured member" shall actually be understood as a planar member with an intended shape covering a fraction of the surface of the plastic substrate.

Thus, each of the structured members is formed by the electrically conductive material deposited on a track or one of the tracks by applying the atmospheric plasma spray process and by removing the portion of the electrically conductive material that has been deposited on the masking material adjacent to the respective track.

It is further noted herewith that the terms "first", "second", etc. are used in this application for distinction purposes only, and are not meant to indicate or anticipate a sequence or a priority in any way.

By using an atmospheric plasma spray process for depositing, the electrically conductive material shows a porous, sponge-like structure (FIG. 3), from which a certain flexibility with regard to bending and stretching arises. Further, as for the electrical conductivity of such deposited material, 40-80% of the electrical conductivity of the respective bulk metal can be achieved. As a result the assembly can be much less prone to developing cracks or fissures in the case of occurring mechanical stress (bending stress or other), while at the same time the ampacity can be improved to a large extent.

The proposed method further replaces complex conventional masking process steps for structuring, which are used in depositing methods such as physical vapor deposition (PVD) or sputtering, by printing masking material that provides low adhesion to the electrically conductive material deposited by the atmospheric plasma spray process so as to serve as a release lacquer for the subsequent cleaning step. Printing methods are well known in many a variation and are well-suited for industrial volume production.

Moreover, with the proposed method an overall topographic variation as low as typically 10 μm can be accomplished, making the assembly virtually unnoticeable to a user. The proposed method also allows for depositing electrically conductive material along the track or the tracks with a very low surface roughness, which can enable the advantageous use of the assembly in high-frequency (for instance radar frequency) applications, i.e. in electromagnetic frequency regions in which power losses in metals due to skin effect dominate.

Preferably, the step of applying an atmospheric plasma spray process includes covering the track or the tracks with an electrically conductive material comprising copper. Copper is most suited and well-studied for atmospheric plasma spray applications. Structured members from an electrically conductive material deposited by an atmospheric plasma spray process can achieve 40-80% of the copper bulk conductivity. Thus, the structured member is 10 to 15 times more electrically conductive than a typical polymer thick film print. However, other metals that appear suitable to those skilled in the art can be employed as well and may comprise, besides or replacing copper, nickel and other thin metal particles.

In particular, the assembly can advantageously form part of a vehicle steering wheel heating device or a vehicle steering wheel sensing device such as a hands off detection (HoD) device. However, the assembly can be used in other technical fields in which a surface of a three-dimensional object having a large curvature in one or more directions of extension needs to be equipped with one or more electrically conductive paths as part of an electronic device. An example of such devices is, without being limited to, an automotive interior heating device for door panels and dashboards.

In preferred embodiments of the method, the step of applying a cleaning process comprises to apply a carbon dioxide cleaning process step or a mechanical brushing step. Using carbon dioxide in its various phases is a well-known process for effective cleaning of delicate surfaces. Using a mechanical brushing step can be a cost-effective alternative.

Preferably, the step of printing a track or tracks or the step of printing a masking material comprises applying a step of screen printing, rotary screen printing or ink jet printing. These printing technologies are fast, cost-effective and highprecision mass production processes, which can achieve low tolerance margins and high reproducibility.

In preferred embodiments of the method, the step of printing a track or tracks comprises printing of copper ink. By that, the electric conductivity of the structured member or members from the electrically conductive material can be supported by an additional electric path or electric paths.

Electrically conductive inks comprising copper are commercially available. In general, however, other metal-based inks could be employed that appear to be suitable to those skilled in the art.

Preferably, the step of applying an atmospheric plasma spray process comprises using metal powder with an average dimension that lies between 5 μm and 20 μm. The metal powder may comprise spherical particles. In this case, the average dimension may refer to an average diameter (such as arithmetic mean or median) of the spherical particles. In this way, an overall topographical variation of the assembly and a surface roughness of the electrically conductive material running along the track or the tracks can be achieved that is sufficiently low for many applications.

In another aspect of the invention, an assembly of one or more structured members from an electrically conductive material on a plastic material substrate is provided that is obtainable by the method disclosed herein.

The application of the disclosed method for producing the assembly substantially changes electrical and mechanical properties of the one or more structured members from an electrically conductive material such that the obtained assembly is distinct from such assembly obtained by conventional methods.

Assemblies obtained with the disclosed method are particularly advantageous for automotive applications. The term "automotive", as used in this patent application, shall particularly be understood as being suitable for use in vehicles including passenger cars, trucks, semi-trailer trucks and buses. The term "vehicle", as used in this application, shall particularly be understood to encompass passenger cars, trucks, semi-trailer trucks and buses.

Preferably, the plastic material substrate is made for the most part from a plastic material that is selected from a group of plastic materials formed by thermoplastic polyurethane (TPU), polyethylene terephthalate (PET), polyimide (PI), polyetherimide (PEI), polyethylene naphthalate (PEN), polyoxymethylene (POM), polyamide (PA), polyphthalamide (PPA), polyether ether ketone (PEEK) and combinations of at least two of these plastic materials.

The term "for the most part", as used in this application, shall particularly be understood as equal to or more than 50%, more preferably more than 70%, and, most preferably, more than 80% in volume, and shall encompass a part of 100%, i.e. the plastic material substrate is completely made from the selected plastic material.

These plastic materials can allow for easy manufacturing, and durable, cost-efficient electrically insulating plastic material substrates of low manufacturing tolerances can be provided in this way.

Preferably, the plastic material substrate is formed as a planar foil. In this way, an assembly with an especially compact design in particular in a direction perpendicular to the surface of the plastic material substrate can be provided. Further, such plastic material substrate can provide flexibility in at least one direction of extension that is sufficient for many applications.

For instance, the planar foil may be of an oblong rectangular shape. Long edges of the planar foil may be arranged in a direction of mechanical stress to be expected during installation or operation, and the one of the orthogonal directions is aligned parallel to short edges of the planar foil. Such embodiments are beneficially employable for applications with large surface curvature such as a vehicle steering wheel.

In such embodiments of the assembly, the first predefined thickness preferably is 10 μm with a predetermined first tolerance range. Such embodiments of the assembly can provide high flexibility, an especially low overall topographical variation and can be arranged very close to a top decor surface of the object, unnoticeable to a user, to enable optimal performance.

In preferred embodiments of the assembly, the second predefined thickness is chosen between 1 μm and 20 μm with a predetermined second tolerance range. An electrically conductive material with a second predefined thickness within this range can provide sufficient ampacity for heating purposes, in particular for vehicle steering wheel or vehicle seat heating.

In preferred embodiments of the assembly, at least one structured member from an electrically conductive material is designed as a signal line of a time-domain reflectometry (TDR) measurement circuit of a vehicle steering wheel hands off detection device. A surface roughness of the at least one structured member may be as low as 0.4 μm to 2.0 μm in terms of the commonly used arithmetic average roughness amplitude parameter Ra, and most preferably even as low as 0.1 μm to 0.4 μm, providing excellent conditions for a high-frequency time-domain reflectometry measurement, for instance for determining a position or positions of a driver's hand or hands on a vehicle steering wheel by the hands off detection device.

Preferably, the plastic material substrate is stretchable in a reversible manner in at least one direction of extension by at least 10%. The term "stretchable", as used in this application, shall be understood such that the plastic material substrate can be stretched by an operator during installation by an amount of at least 10% of a mechanically unloaded extension length. By employing a stretchable plastic material substrate, a flexible electric heating member or a flexible capacitive sensing electrode can be provided for use with particular advantage in applications with large surface curvature such as a vehicle steering wheel. In such applications, the electric heating member can be installed in a manner that is adapted to a high extent to a surface contour of an object to be heated, and an excellent heat transfer to the object can be enabled.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies these embodiments of the invention in particular in connection with the figures.

BRIEF DESCRIPTION OF THE DRAWINGS

Further details and advantages of the present invention will be apparent from the following detailed description of not limiting embodiments with reference to the attached drawing, wherein.

In the different figures, the same parts are always provided with the same reference symbols or numerals, respectively. Thus, they are usually only described once.

DETAILED DESCRIPTION

Figure 1:
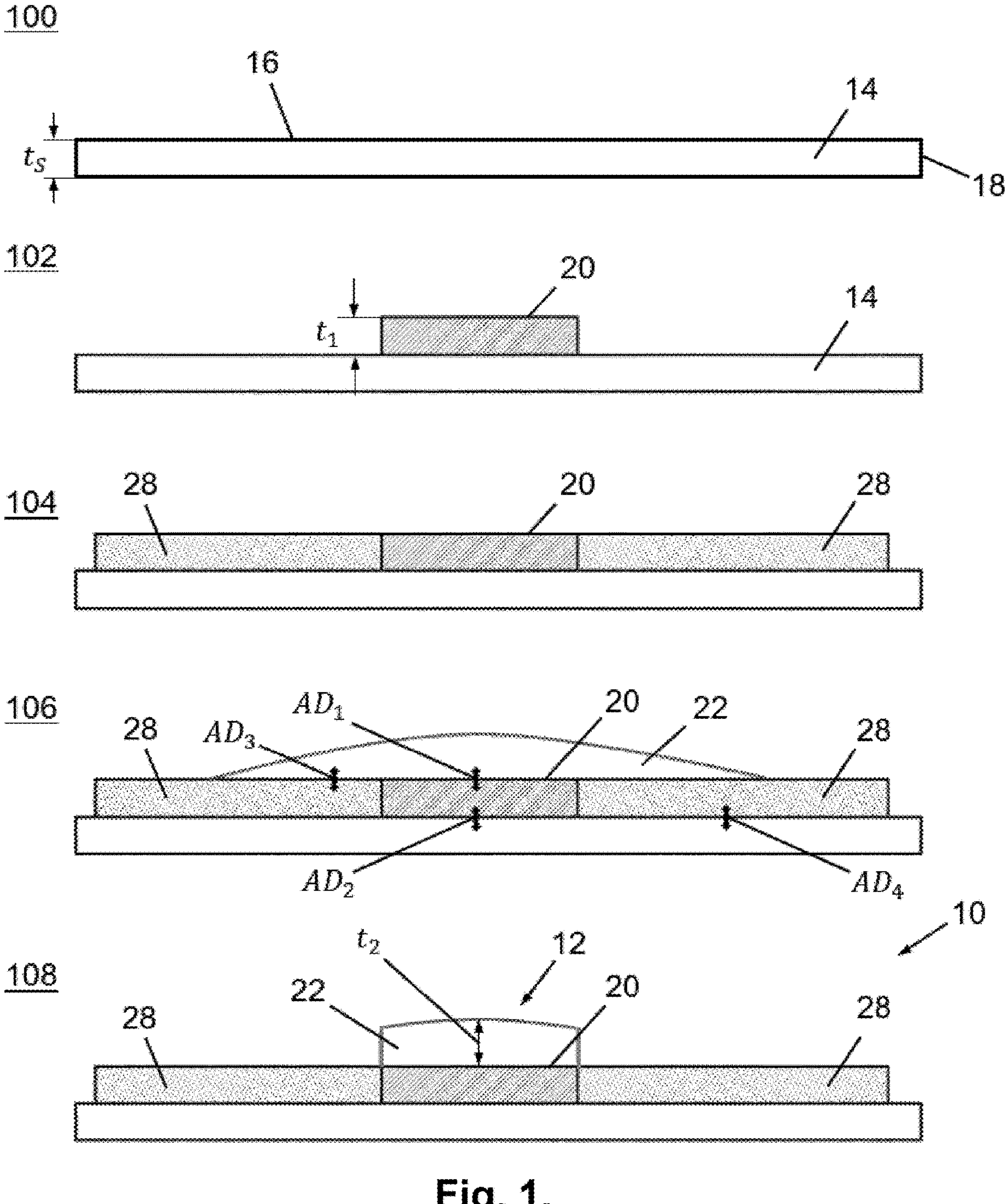
FIG. 1 schematically illustrates the method of producing an assembly in accordance with an embodiment of the invention in a cross-sectional side view.

FIG. 1 schematically illustrates the method of producing an assembly 10 in accordance with an embodiment of the invention in a cross-sectional side view. It is pointed out herewith that FIG. 1 cannot be regarded as a drawing to scale. In particular, a ratio of dimensions in height to transverse dimensions in the drawing plane was chosen for reasons of illustration and does not have to correspond to the actual conditions.

The assembly 10 comprises a plurality of structured members 12, one of which is exemplarily shown in FIG. 1, from an electrically conductive material 22 on a plastic material substrate 14. The plastic material substrate 14 may be completely made from thermoplastic polyurethane (TPU) and may be formed as a planar foil having a thickness $t_S$ of 10 μm. In other embodiments, the plastic material substrate 14 may be made for the most part from another plastic material such as PET, PI, PEI, PEN, POM, PA, PPA, PEEK or a combination of at least two of these plastic materials.

The plastic material substrate 14 has an upper surface 16 and an opposite bottom surface. In this specific embodiment, the plurality of structured members 12 are shown to be arranged on the upper surface 16 only, however, the structured members 12 may be formed on both surfaces of the plastic material substrate 14.

The plastic material substrate 14 may have an oblong, generally rectangular shape with two parallel long edges 18 and two parallel short edges, which run parallel to the drawing plane of FIG. 1, and a large aspect ratio of more than 20. The long edges 18 of the plastic material substrate 14 are arranged in a direction of main mechanical stress to be expected during installation or operation. The planar foil shape of the plastic material substrate 14 and the small thickness $t_S$ of 10 μm give the substrate 14 advantageous flexural properties. Moreover, by the choice of the material as TPU, the plastic material substrate 14 is stretchable in a reversible manner in two directions of extension, which run parallel to the long edges 18 and the short edges, respectively, by an amount of more than 10%.

The assembly 10 may form part of a time-domain reflectometry measurement circuit of a vehicle steering wheel hands off detection device (not shown). The structured member 12 may be designed as a signal line of the time-domain reflectometry measurement circuit, wherein the signal line is meandering from one short edge of the plastic material substrate 14 to the opposite short edge. The large aspect ratio allows a one-piece installation of the signal line at a vehicle steering wheel. Due to the stretchability of the plastic material substrate 14, the signal line can be installed in a manner that is adapted to a high extent to a surface contour of, for instance, a rim of the vehicle steering wheel, and an excellent measurement scenario for capacitive hand detection on the steering wheel can be achieved.

An embodiment of the method of producing the assembly 10 in accordance with the invention is described in the following. The assembly 10 is obtainable by the possible embodiment of the method as schematically illustrated in FIG. 1.

In a first step 100 of the method, the plastic material substrate 14, which is built entirely flat, is provided in a suitable holding (not shown) with the upper surface 16 pointing upwards. In a next step 102 a track 20 is printed on the upper surface 16 of the plastic material substrate 14. The track 20 corresponds to an intended course of the structured member 12. The step 102 of printing may comprise a screen printing process. The material used for printing may comprise copper ink, and the printed track 20 has a first predefined thickness $t_1$ that may be selected to be 10 μm. The first predefined thickness $t_1$ may have a predetermined first tolerance range of ±0.2 μm. In any case, the track material is selected to have a strong adherence $AD_2$ to the plastic material substrate 14 as well as a strong adherence $AD_1$ to the electrically conductive material 22 that is intended for the structured member 12.

In another step 104 of the method, a masking material 28 is printed directly on the upper surface 16 of the plastic material substrate 14. The printed masking material 28 has the first predefined thickness $t_1$ that may be selected to be 10 μm, with the same predetermined first tolerance range. The step 104 of printing the masking material 28 may be the same screen printing process as used for the printing of the track 20. However, the step 104 of printing the masking material 28 may as well comprise a rotary screen printing or an inkjet printing process.

As the masking material 28 is printed with the same thickness as the track 20, namely with the first predefined thickness $t_1$, upper surfaces of the track 20 and the masking material 28, respectively, are aligned. In any case, the masking material 28 is selected to have an adherence $AD_4$ to the plastic material substrate 14 that is larger than an adherence $AD_3$ to the electrically conductive material 22 that is intended for the structured member 12.

Figure 2:
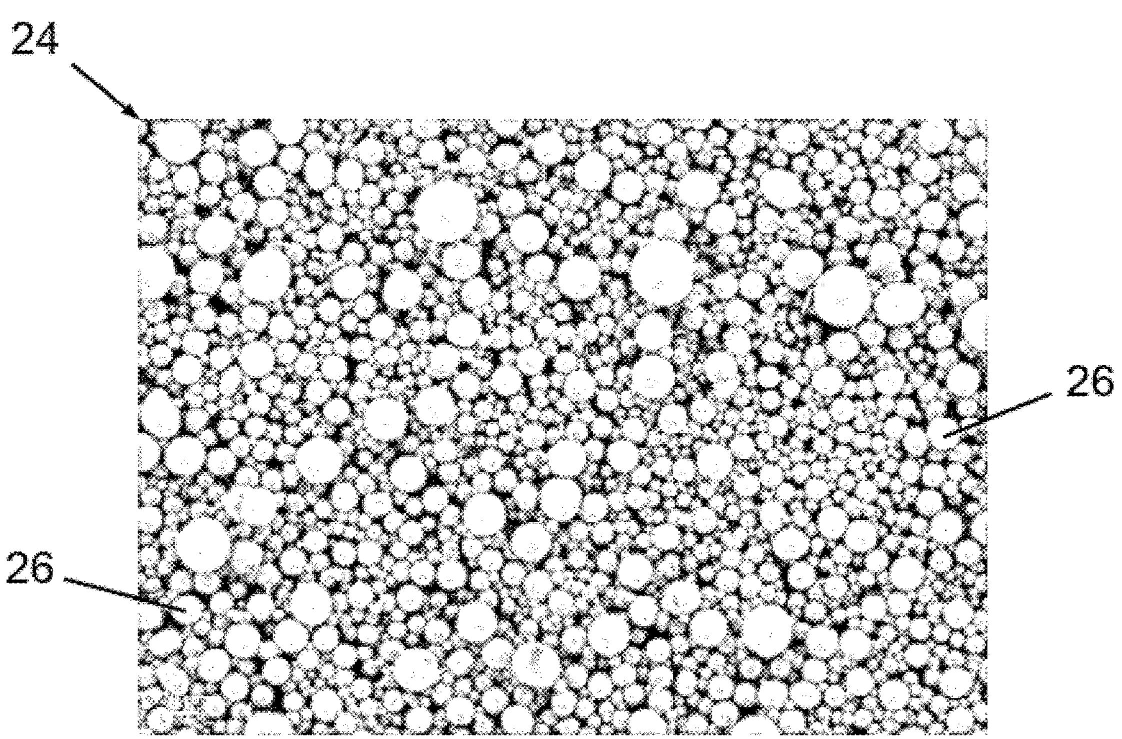
FIG. 2 is a microscopic image of a metal powder mainly comprising copper for use in the step of applying an atmospheric plasma spray process.

In a next step 106, an atmospheric plasma spray process is applied to cover the track 20 and a portion of the masking material 28 adjacent to the track 20 with the electrically conductive material 22. The material used in the atmospheric plasma spray process is metal powder 24. FIG. 2 is a microscopic image of the used metal powder 24, which may mainly comprise copper. The commercially available metal powder 24 comprises a vast number of metal spheres 26 having an average dimension given by an average diameter of about 15 μm as a median value.

Referring again to FIG. 1, the electrically conductive material 22 of the structured member 12 has a second predefined thickness $t_2$ that may be selected to be 15 μm. In the cross-sectional side view of FIG. 1, the electrically conductive material 22 of the structured member 12 is shown to have an arcuate thickness profile, with a maximum thickness $t_2$ in a region above the track 20. The second predefined thickness $t_2$ may have a predetermined second tolerance range of +0.25 μm. In other embodiments, the second predefined thickness $t_2$ may be selected to lie in the range between 1 μm and 20 μm.

In another step 108 then, a cleaning process is applied to remove the electrically conductive material 22 from the portion of the masking material 28 adjacent to the track 20. This is possible because the adherence $AD_1$ of the track material to the electrically conductive material 22, and also the adherence $AD_2$ of the track material to the plastic material substrate 14 is larger than the adherence $AD_3$ of the masking material 28 to the electrically conductive material 22:

$$AD_1 \approx AD_2,$$

$$AD_4 > AD_3, \text{ and}$$

$$AD_1 > AD_3$$

In this specific embodiment, the step 108 of applying a cleaning process comprises to apply a carbon dioxide cleaning process step. In other embodiments, the step 108 of applying a cleaning process may comprise a mechanical brushing step or any other cleaning process step that appears suitable to those skilled in the art.

Figure 3:
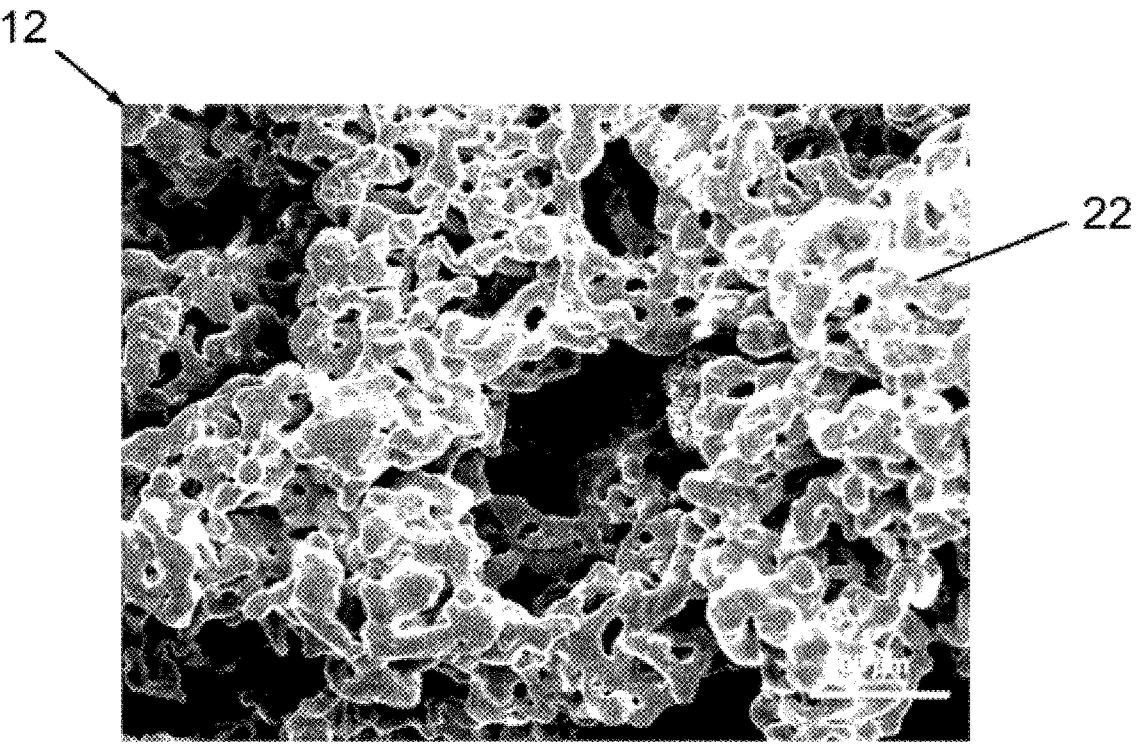
FIG. 3 is a microscopic image of the metal deposited by applying the atmospheric plasma spray process to the metal powder pursuant to FIG. 1.

FIG. 3 is a microscopic image of the electrically conductive material 22 formed by metal, which has been deposited by applying the atmospheric plasma spray process to the metal powder 24 shown in FIG. 2. The morphology of the deposited electrically conductive material 22 is characterized by a sintering of the metal spheres 26 of the metal powder 24, forming electrical connections that provide excellent electrical conductivity. Further, mechanical connections between the metal spheres 26 are established to build up a sponge-like structure, providing mechanical flexibility in comparison to the corresponding bulk material.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. Method of producing an assembly of one or more structured members from an electrically conductive material on a plastic material substrate, the method comprising at least the following steps:

providing an at least locally flat substrate from plastic material, printing on a surface of the plastic material substrate a track or tracks of a first predefined thickness and corresponding to an intended course of the one or more structured members from a material with strong adherence to both the plastic material substrate and the electrically conductive material, after the step of printing on a surface of the plastic material substrate a track or tracks, printing a masking material with the first predefined thickness directly on the surface of the plastic material substrate, the masking material having an adherence to the plastic material substrate that is larger than an adherence to the electrically conductive material, wherein the adherence of the track material to the electrically conductive material is larger than the adherence of the masking material to the electrically conductive material, applying an atmospheric plasma spray process to cover the track or the tracks and at least a portion of the masking material adjacent to each respective track with the electrically conductive material with a second predefined thickness, and applying a cleaning process to remove the electrically conductive material from at least the portion of the masking material adjacent to each respective track.

2. The method as claimed in claim 1, wherein the step of applying a cleaning process comprises to apply a carbon dioxide cleaning process step or a mechanical brushing step.

3. The method as claimed in claim 1, wherein the step of printing a track or tracks or the step of printing a masking material comprises applying a step of screen printing, rotary screen printing or ink jet printing.

4. The method as claimed in claim 1, wherein the step of printing a track or tracks comprises printing of copper ink.

5. The method as claimed in claim 1, wherein the step of applying an atmospheric plasma spray process comprises using metal powder with an average dimension that lies between 5 μm and 20 μm.

* * * * *